(12) United States Patent
Kim

(10) Patent No.: US 7,054,160 B2
(45) Date of Patent: May 30, 2006

(54) APPARATUS FOR ATTACHING AND DETACHING CIRCUIT BOARDS

(75) Inventor: Hak-Sul Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/000,423

(22) Filed: Dec. 1, 2004

(65) Prior Publication Data

US 2005/0162837 A1   Jul. 28, 2005

(30) Foreign Application Priority Data

Jan. 27, 2004   (KR) ...................... 10-2004-0005157

(51) Int. Cl.
*H05K 7/12* (2006.01)

(52) U.S. Cl. ...................... 361/754; 361/756; 361/798; 361/801; 361/759; 361/802

(58) Field of Classification Search ................ 361/754, 361/798, 801, 802, 726, 732, 740, 759, 747; 312/215, 216, 223.1, 223.2
See application file for complete search history.

(56) References Cited

U.S. PATENT DOCUMENTS

| | | | |
|---|---|---|---|
| 6,185,106 B1 * | 2/2001 | Mueller | 361/798 |
| 6,373,713 B1 * | 4/2002 | Jensen et al. | 361/759 |
| 6,381,146 B1 * | 4/2002 | Sevier | 361/754 |
| 6,556,451 B1 | 4/2003 | Feightner et al. | |
| 6,667,879 B1 | 12/2003 | Salinas et al. | |
| 6,693,800 B1 | 2/2004 | Lin et al. | |
| 2001/0046117 A1 | 11/2001 | Felcman et al. | |
| 2003/0080568 A1 | 5/2003 | Busby et al. | |
| 2003/0151889 A1 | 8/2003 | Cannon | |
| 2003/0210515 A1 | 11/2003 | Rahmouni | |
| 2003/0210517 A1 | 11/2003 | Syring et al. | |
| 2003/0210520 A1 | 11/2003 | Chien et al. | |
| 2004/0085720 A1 | 5/2004 | Arbogast et al. | |

FOREIGN PATENT DOCUMENTS

KR   20-2003-29767   9/2003

* cited by examiner

*Primary Examiner*—Kamand Cuneo
*Assistant Examiner*—Dameon E. Levi
(74) *Attorney, Agent, or Firm*—Robert E. Bushnell, Esq.

(57) ABSTRACT

An apparatus for attaching and detaching a circuit board includes: a main body open at a front thereof and including a plurality of racks arranged in an interior portion thereof; a motherboard arranged at an inner rear portion of the main body; a connector arranged on the motherboard and adapted to transmit electronic signals and electrical power; a guide bracket including a clamped groove arranged in an interior portion thereof and adapted to clamp one side of a circuit board and further including a plurality of sockets arranged on a front thereof and adapted to be arranged on the front of the main body; and an ejector arranged on one side of a lower portion of the guide bracket and adapted to be pivoted by pushing and pulling to attach and detach the circuit board.

8 Claims, 7 Drawing Sheets

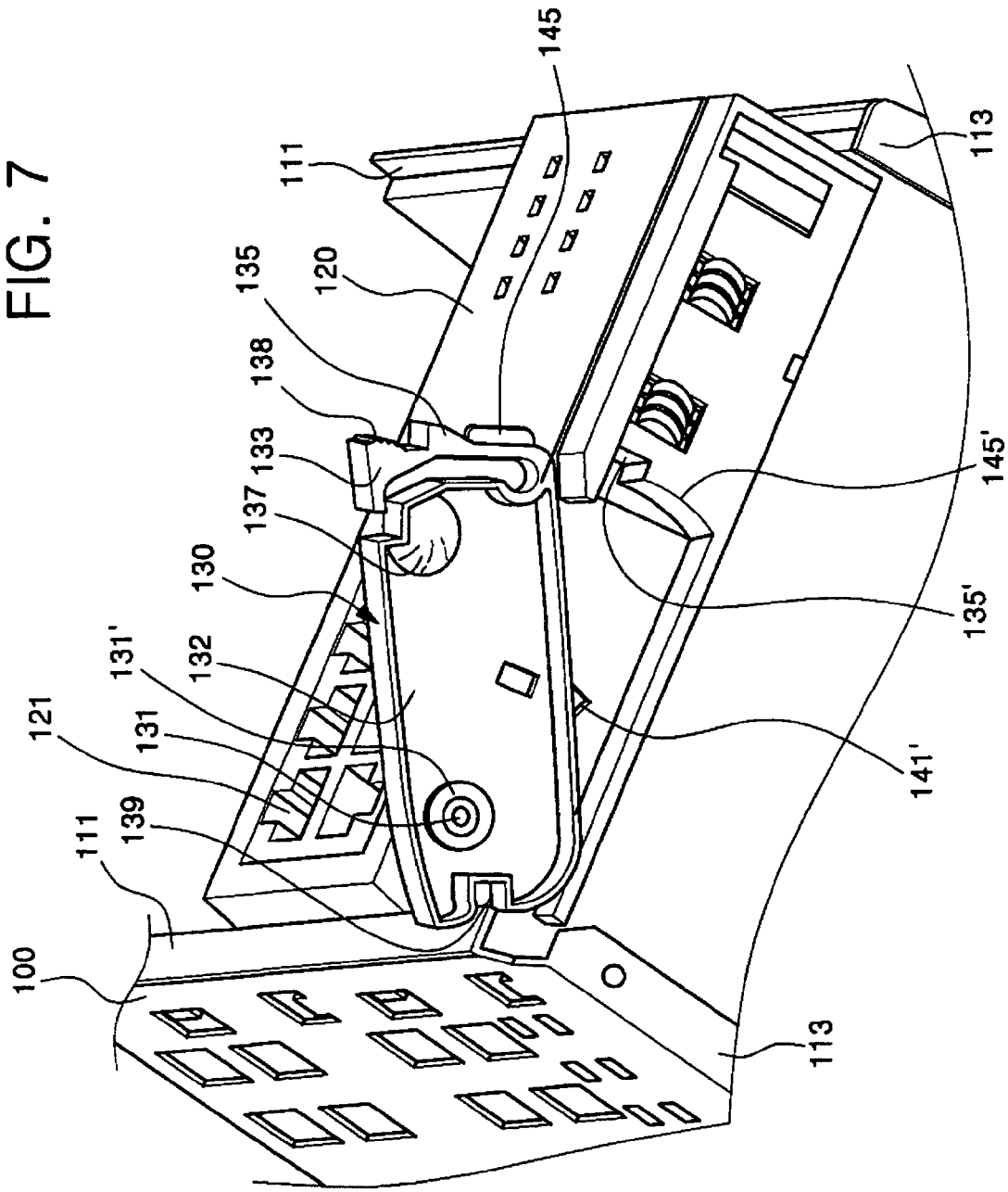

APPARATUS FOR ATTACHING AND DETACHING CIRCUIT BOARDS

CLAIM OF PRIORITY

This application makes reference to, incorporates the same herein, and claims all benefits accruing under 35 U.S.C. §119 from an application for APPARATUS FOR MOUNTING/DISMOUNTING CIRCUIT BOARD earlier filed in the Korean Intellectual Property Office on 27 Jan. 2004 and there duly assigned Serial No. 2004-5157.

BACKGROUND OF THE INVENTION

1. Field of the Invention

The present invention relates to an apparatus for attaching and detaching circuit boards and, more particularly, to an apparatus for attaching and detaching circuit boards, in which the circuit boards are easily attached and detached to and from brackets for the circuit boards.

2. Description of the Related Art

In general, most equipment ranging from computer equipment from small computers to large computers to electronic communication equipment needed for networking usually employs a structure capable of attaching and detaching a plurality of circuit boards.

Such equipment is very diverse in operating environments. Hence, its generality makes up for a disadvantage of having difficulty in realizing equipment adaptable to all predictable operation environments.

In other words, a motherboard of the equipment is designed to handle only a basic function, and other functions providing different applications according to the operating environment are realized by option boards. The option boards are selectively attached and detached to and from the motherboard. Thus, it is possible not only to perform effective operation such as control on the relevant field but also to provide modularization on the basis of each function through application of the option boards.

However, in prior art circuit board attaching and detaching apparatus, there is a problem in that the user must fasten or unfasten a fixing bolt with a tool whenever the option board is attached or detached.

Furthermore, in prior art circuit board attaching and detaching apparatus, the option board is fixed to a face plate on one side and is connected to a connector on the other side. Thus, when the user pushes the face plate backward to connect the option board to the connector, or when the user pulls the face plate forward to disconnect the option board from the connector, a great force is required.

The following patents each discloses features in common with the present invention but do not teach or suggest the inventive features specifically recited in the present application: U.S. Patent Application No. 2004/0085720 to Arbogast et al., entitled TOOL-LESS LATCH MECHANISM FOR AN ENCLOSURE PANEL, published on May 6, 2004; U.S. Patent Application No. 2003/0210520 to Chien et al., entitled DRIVE BRACKET ASSEMBLY WITH FASTENER, published on Nov. 13, 2003; U.S. Patent Application No. 2003/0210515 to Rahmouni, entitled LATCH AND RELEASE MECHANISM FOR A PANEL OF A COMPUTER HARDWARE DEVICE, published on Nov. 13, 2003; U.S. Patent Application No. 2003/0210517 to Syring et al., entitled APPARATUS FOR RETAINING PERIPHERAL DEVICE, published on Nov. 13, 2003; U.S. Patent Application No. 2003/0151889 to Cannon, entitled BRACKET FOR QUICK INSTALLATION AND REMOVAL OF SYSTEM COMPONENTS IN A COMPUTER SYSTEM, published on Aug. 14, 2003; U.S. patent application No. 2003/0080568 to Busby et al., entitled LATCHING MECHANISM FOR SECURING A COMPUTER COMPONENT INTO A HOUSING, published on May 1, 2003; U.S. Patent Application No. 2001/0046117 to Felcman et al., entitled COMPUTER HAVING OPTION CARD MODULE LATCHING AND DRIVE BAY PIVOT STRUCTURES, published on Nov. 29, 2001; U.S. Pat. No. 6,693,800 to Lin et al., entitled EXPANSION CARD MOUNTING APPARATUS, issued on Feb. 17, 2004; U.S. Pat. No. 6,667,879 to Salinas et al., entitled SYSTEM FOR LATCHING AND EJECTING A MODULAR COMPONENT FROM AN ELECTRONIC DEVICE, published on Dec. 23, 2003; and U.S. Pat. No. 6,556,451 to Feightner et al., entitled ADJUSTABLE GUIDE MECHANISM FOR COMPUTER ADD IN CARD RETENTION, issued on Apr. 29, 2003.

SUMMARY OF THE INVENTION

Therefore, to solve the foregoing problems, the present invention enables a circuit board to be attached and detached in a one-touch fashion and with little force using an ejector to attach and detach the circuit board to and from the main body.

Furthermore, it is another object to improve appearance by eliminating a fixing bolt protruding from a front of a main body.

In order to accomplish these objects, according to one aspect of the present invention, an apparatus is provided comprising: a main body open at a front thereof and including a plurality of racks arranged in an interior portion thereof; a motherboard arranged at an inner rear portion of the main body; a connector arranged on the motherboard and adapted to transmit electronic signals and electrical power; a guide bracket including a clamped groove arranged in an interior portion thereof and adapted to clamp one side of a circuit board and further including a plurality of sockets arranged on a front thereof and adapted to be arranged on the front of the main body; and an ejector arranged on one side of a lower portion of the guide bracket and adapted to be pivoted by pushing and pulling to attach and detach the circuit board.

The guide bracket is preferably adapted to be attached and detached to and from the main body in a horizontal direction.

The ejector preferably comprises: a pivot member pivoting forward and backward and including a pivot hole arranged on one side thereof; and a pivot axle arranged to pass through the pivot hole of the pivot member on one side of a bottom surface of the guide bracket and adapted to allow the pivot member to be pivoted.

Each of the plurality of racks preferably includes a support adapted to guide and support insertion of the guide bracket on both sides thereof; and the pivot member includes a pivot guide groove adapted to support pivoting of the pivot member using one side of the support as a point of force application on one end thereof adjacent to the pivot hole.

The pivot member preferably includes a resilient push piece spaced a certain interval apart from the pivot member on the other end thereof remote from the pivot hole.

The pivot member preferably includes a first guide member protruding from and bent on an upper side thereof at a certain angle and a first guide hole arranged on a bottom surface of the main body to receive the first guide member and adapted to guide the pivoting of the pivot member.

The resilient push piece preferably includes a hooking nose protruding from an outer side thereof; and the main body includes a hooked groove arranged to correspond to the hooking nose and into and from which the hooking nose is inserted and released as the pivot member pivots.

The resilient push piece preferably includes a second guide member protruding from an upper outer side thereof; and the main body includes a second guide hole adapted to guide the pivoting of the pivot member together with the second guide member.

The pivot member preferably includes a pivot auxiliary recess spaced a certain interval apart from the resilient push piece on a top surface thereof.

The resilient push piece preferably includes a knurl on an outer side thereof.

BRIEF DESCRIPTION OF THE DRAWINGS

A more complete appreciation of the present invention, and many of the attendant advantages thereof, will be readily apparent as the same becomes better understood by reference to the following detailed description when considered in conjunction with the accompanying drawings in which like reference symbols indicate the same or similar components, wherein:

FIG. 7 is a view of a detaching operation of an apparatus for attaching and detaching a circuit board according to an embodiment of the present invention.

DETAILED DESCRIPTION OF THE INVENTION

Korean Utility Model Application Serial No. 20-2003-0029767 to Dong-Wan Kang, entitled DEVICE FOR MOUNTING AND DISMOUNTING AN OPTION BOARD, filed on 19 Sep. 2003 and registered on 9 Dec. 2003 (Registration No. 20-0336618), refers to an option board attached to a motherboard.

Figure 1:
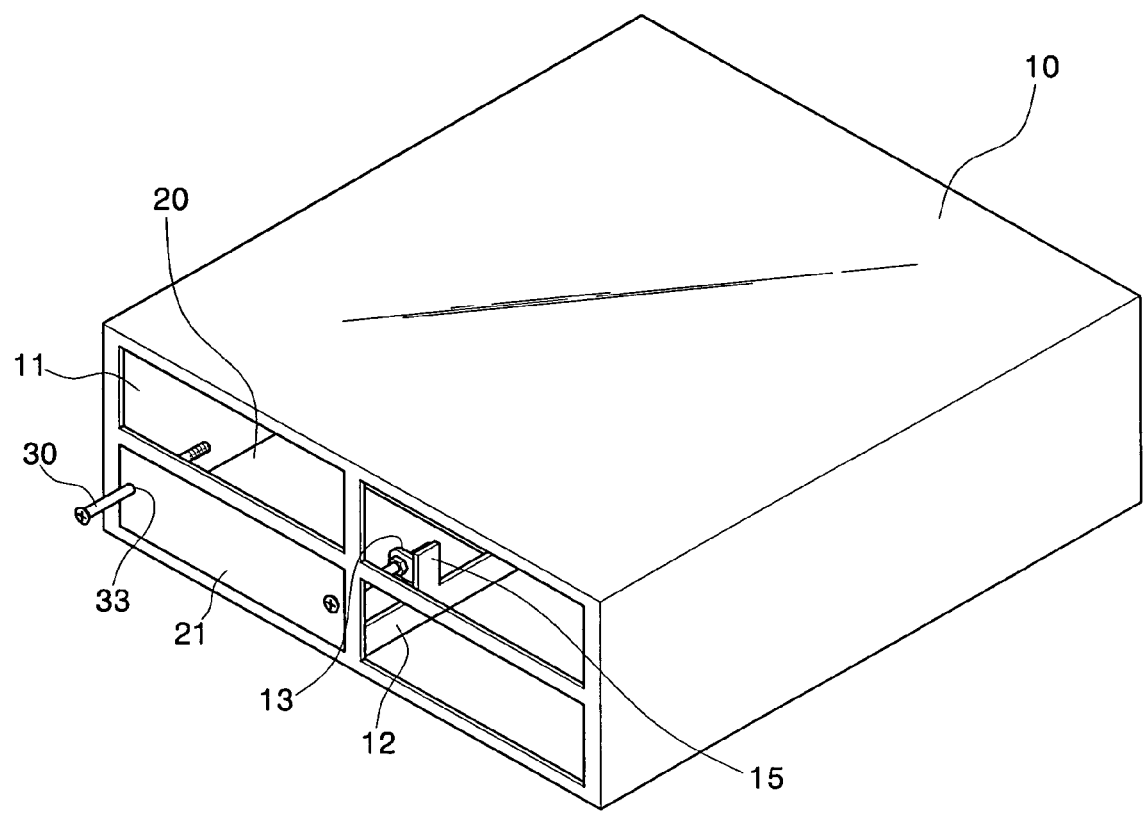
FIGS. 1 and 2 are views of attaching and detaching operations of a conventional circuit board.

Specifically, as shown in FIG. 1, for the system equipment, a main chassis 10 includes a plurality of board inserting openings 11 to and from which option boards are attached and detached at the front of the main chassis 10 and which have rectangular slot shapes, and a guide bracket 12 extending in a longitudinal direction of the main chassis 10 on both sides of a lower end of each board inserting opening 11 and integrally fixed to the main chassis 10.

The main chassis 10 includes a connector (not shown) which is coupled to an option board 20.

The guide bracket 12 includes a support 15 which protrudes upward and perpendicular to the guide bracket 12 and which is spaced a certain distance apart from a surface where the option board 20 is brought into close contact with a face plate 21. A fixed piece or nut 13 is arranged on a one side of the support 15.

Both sides of the face plate 21 each include a bolt hole 33 which is arranged to corresponding to the fixed piece 13 and through which a fixing bolt 30 passes.

The fixing bolt 30 must protrude from the front of the face plate 21 by a predetermined amount.

Figure 2:
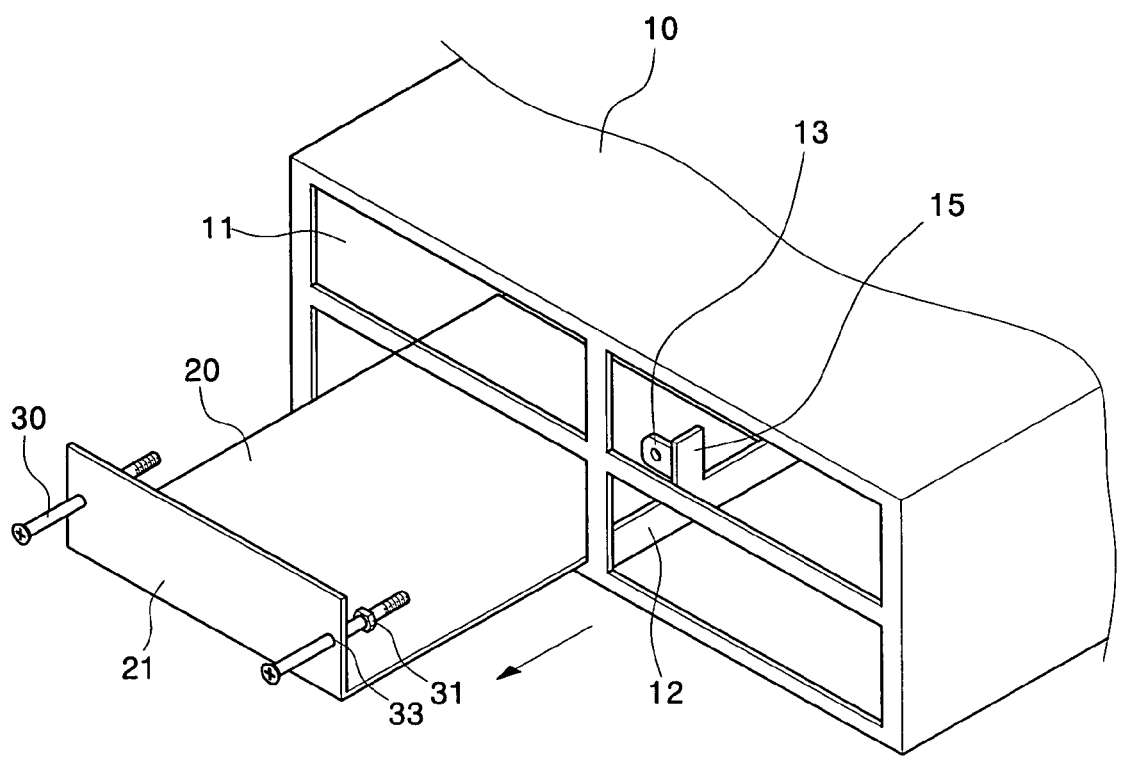

Therefore, as shown in FIG. 2, each option board 20 attached to the face plate 21 is inserted into the board inserting opening 11 by the guide of the guide bracket 12 of the main chassis 10, and then the fixing bolt 30 passes through the bolt hole 33 and is screwed to the fixed piece 13 so that the threaded end of the fixing bolt protrudes beyond the fixed piece to attach the option board 20 to the main chassis 10. The fixing bolt 30 is unscrewed, and then a user grasps the unscrewed fixing bolt 30 to pull the face plate 21 forward, to detach the option board 20 from the main chassis 10.

However, in this option board attaching and detaching apparatus, there is a problem in that the user must fasten or unfasten the fixing bolt 30 with a tool whenever the option board is attached or detached.

Furthermore, the option board 20 is fixed to the face plate 21 on one side and is connected to the connector on the other side. Thus, when the user pushes the face plate 21 backward to connect the option board 20 to the connector, or when the user pulls the face plate 21 forward to disconnect the option board 20 from the connector, a great force is required.

The present invention will now be described more fully hereinafter with reference to the accompanying drawings, in which exemplary embodiments of the present invention are shown.

Figure 3:
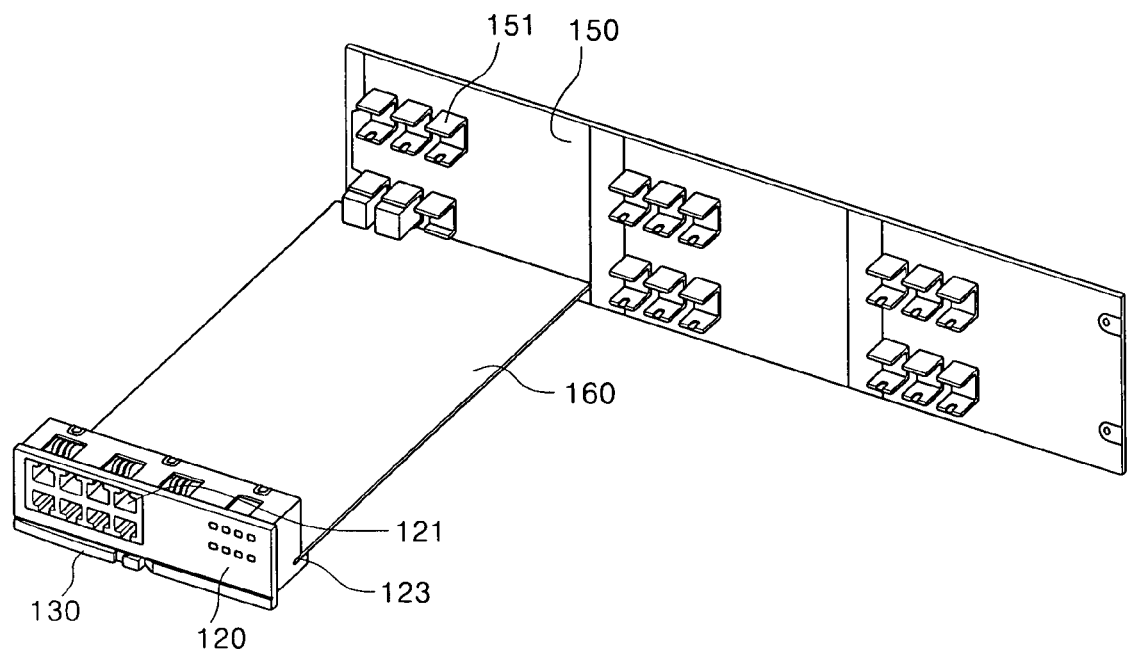
FIG. 3 is a view of a circuit board according to an embodiment of the present invention.
Figure 4:
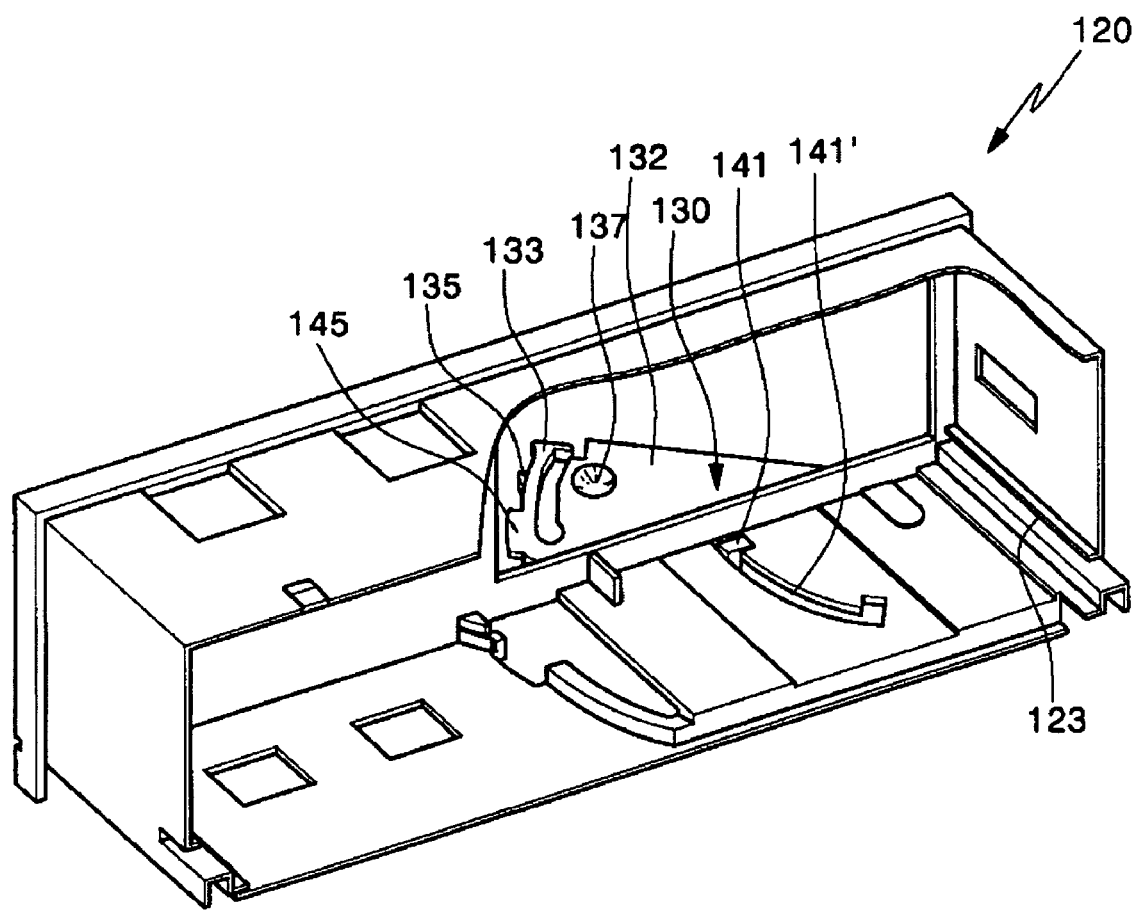
FIG. 4 is a view of an interior of an apparatus for attaching and detaching a circuit board according to an embodiment of the present invention.

FIG. 3 is a view of a circuit board according to an embodiment of the present invention, and FIG. 4 is a view of an interior of an apparatus for attaching and detaching a circuit board according to an embodiment of the present invention.

As shown in the drawings, the circuit board attaching and detaching apparatus may comprise a main body 100 which is open at the front thereof and includes a plurality of racks 113 in the interior thereof, a motherboard 150 which is arranged at the inner rear portion of the main body 100 and includes at least one connector 151 for transmitting electronic signals and electrical power to a circuit board 160, a guide bracket 120 mounted on the circuit board 160 to guide the circuit board 160 into the rack 113. The guide bracket 120 includes a clamped groove 123 in the interior thereof to clamp one side of the circuit board 160 and a plurality of sockets 121 at the front thereof and is arranged at the front of the main body 100. An ejector 130 is rotatably mounted on the guide bracket 120. The ejector 130 is arranged on one side of the lower portion of the guide bracket 120 and pivots by pushing or pulling of a user. The ejector 130 holds the guide bracket 120 by pushing the main body 100 when the circuit board 160 is attached to the connector 151 and detaches the circuit board 160 from the connector 151 by pulling the guide bracket 120 as the ejector 130 rotates.

Each rack 113 of the main body 100 includes a support 111 on both sides thereof so as to guide and support insertion of each guide bracket 120.

Preferably, the guide bracket 120 is horizontally attached to and detached from the main body 100 with the circuit board 160 clamped horizontally to the clamped groove 123 in the guide bracket 120.

The ejector 130 may comprise a pivot member 132 which includes a pivot hole 131' on one side thereof and pivots forward and backward about the pivot hole 131', and a pivot axle 131 which is fixed on one side of the rear of the guide bracket 120 to pass through the pivot hole 131' of the pivot member 132 and is pivoted to rotate the pivot member 132. The pivot member 132 rotatably mounted on the guide bracket 120. The pivot member 132 pulls the guide bracket 120 as the pivot member 132 rotates.

The pivot axle 131 fixes one side of the pivot member 132 and simultaneously becomes a pivotal center of the pivot member 132.

The pivot member 132 includes a guide groove 139 on one end adjacent to the pivot hole 131', wherein the guide groove 139 supports pivoting of the pivot member 132 using one side of each support 111 as a point of force application when the pivot member 132 pivots. The guide groove 139 is inserted into the side of the support 111. As the pivot member 132 pivots, the guide groove 139 exerts force on the support 111. Therefore, the pivot member 132 pulls the guide bracket 120 along the guide groove 139 to detach the circuit board 160 from the connector 151.

The pivot member 132 includes a first guide member 141 and a first guide hole 141', wherein the first guide member 141 protrudes and is bent on its upper side at a certain angle, and the first guide hole 141' is formed on a bottom surface of the guide bracket 120 so that the first guide member 141 is inserted. Then, as the pivot member 132 pivots, both an inner surface of the first guide member 141 and an inner bottom surface of the guide bracket 120 are brought in to contact with each other.

The ejector 130 may includes a resilient push piece 133 spaced a certain distance apart from the pivot member 132 on the other end distant from the pivot hole 131'. The resilient push piece 133 is cantilevered on the pivot member. The resilient push piece 133 has a hooking nose 135 protruding on the outer side thereof. The main body 100 includes a hooked recess 135', which is formed to correspond to the hooking nose 135 and into and from which the hooking nose 135 is inserted and separated as the pivot member 132 pivots. The hooking nose 135 is inserted into the hooked recess 135' as the pivot member 132 rotates for engaging the pivot member 132 to the main body 100. Preferably, the pivot member 132 includes a half-spherical pivot auxiliary recess 137, which is spaced a certain interval apart from the resilient push piece 133 to facilitate the pulling of the pivot member 132. Furthermore, the resilient push piece 133 has a knurl 138 on the outer side thereof.

The resilient push piece 133 has a second guide member 145 protruding from an upper outer side thereof. The main body 100 includes a second guide hole 145' so as to come into contact with an bottom surface of the second guide member 145 as the pivot member 132 pivots. The second guide member 145 slides along the second guide hole 145' to guide the pivot member 132 as the pivot member 132 pivots.

A description follows as to an operation and an effect of the circuit board attaching and detaching apparatus configured as set forth above in accordance with an embodiment of the present invention.

Figure 5:
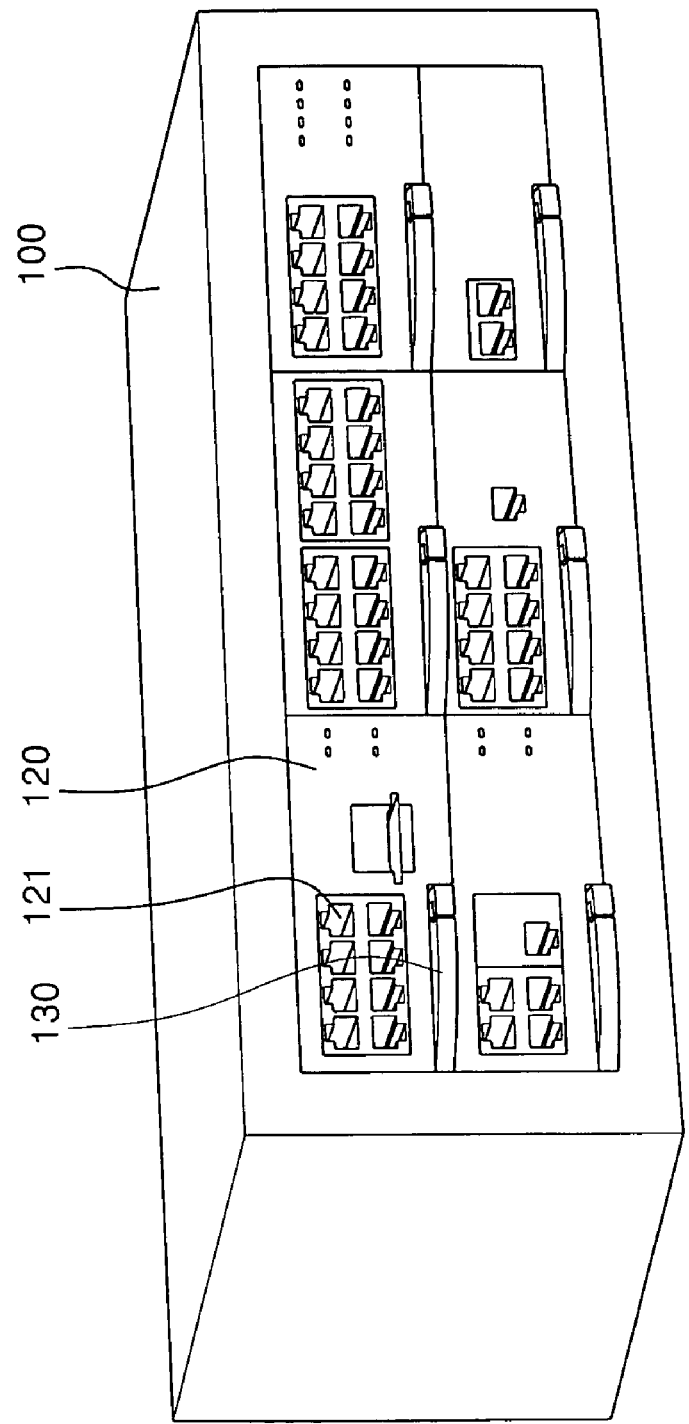
FIG. 5 is a view of electronic equipment attached with a circuit board according to an embodiment of the present invention.
Figure 6:
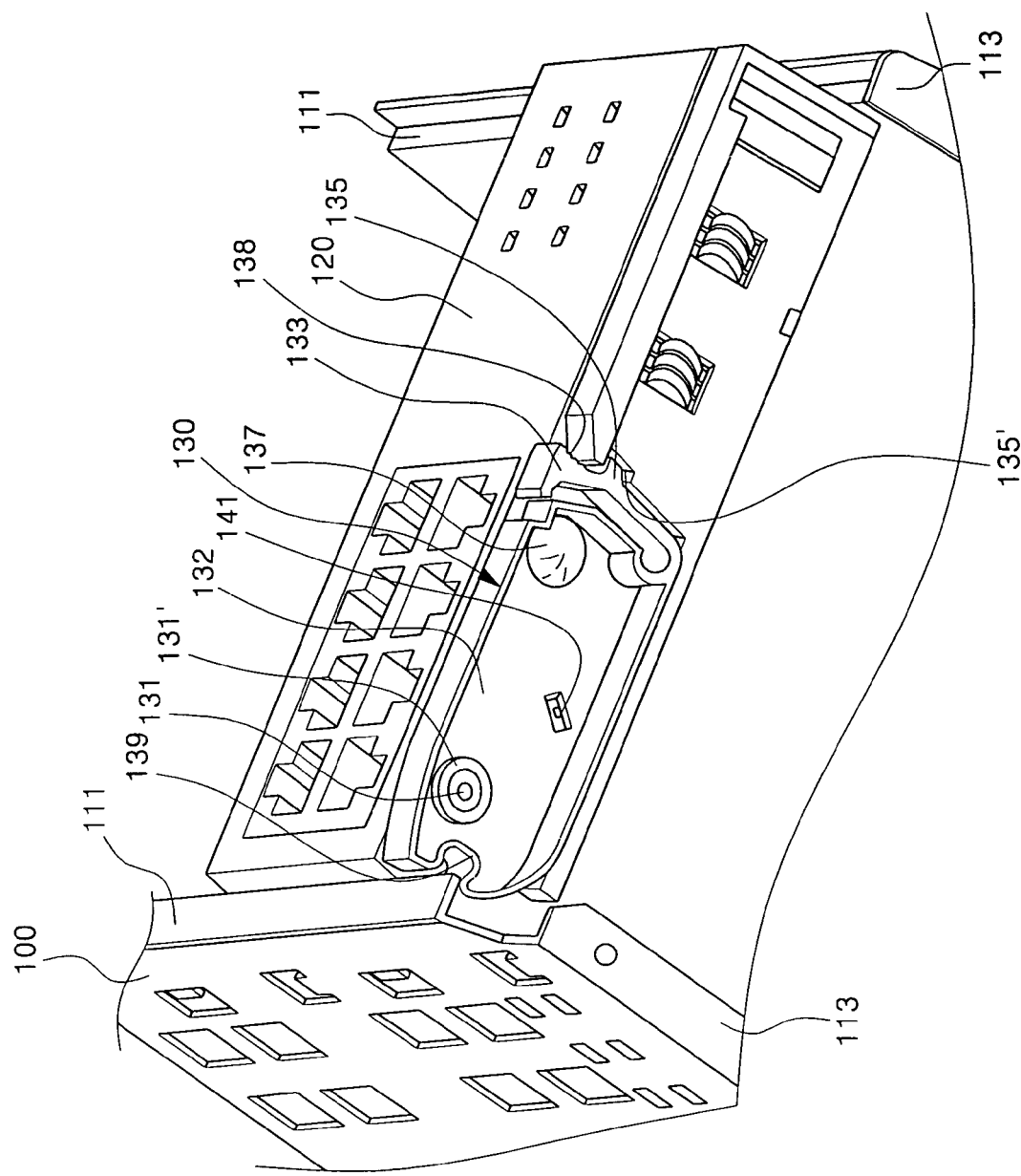
FIG. 6 is a view of an attaching operation of an apparatus for attaching and detaching a circuit board according to an embodiment of the present invention.

As shown in FIGS. 5 and 6, when the user pivots the ejector 130 attached to the lower portion of the guide bracket 120 to push it into the lower portion of the guide bracket 120, the guide bracket 120 to which the circuit board 160 is fixed is horizontally inserted into the rack 113 of the main body 100, and the hooking nose 135 formed on the outer side of the resilient push piece 133 of the pivot member 132 is inserted into the hooked groove 135' of the main body 100. The resilient push piece 133 holds the guide bracket 120 by pushing the main body 100.

One side of the circuit board 160 is fixed to the clamped groove 123 of the guide bracket 120, and the other side is connected to the motherboard 150 arranged at the inner rear portion of the main body 100 so as to be attached to the main body 100.

As shown in FIG. 7, when the user detaches the circuit board 160 from the main body 100, the user pulls the knurl 138 formed on the outer side of the resilient push piece 133 which is spaced a certain interval apart from the pivot member 132 while pushing against the pivot member 132. Thus, the hooking nose 135 protruding from the outer side of the resilient push piece 133 is released from the hooked groove 135' of the main body 100.

The guide groove 139 formed on the end adjacent to the pivot hole 131' of the pivot member 132 is inserted into the support 111 provided on both sides of the rack 113 simultaneously with the pivoting of the pivot member 132, thereby serving as the point of force application when the pivot member 132 pivots.

The first guide member 141, which protrudes from and is bent on the upper side of the pivot member at a certain angle, is inserted into the first guide hole 141'. The second guided member 145, which protrudes from the upper outer side of the resilient push piece 133, is inserted into the second guide hole 145' formed on the main body 100 and guides the pivoting the pivot member 132.

The circuit board 160, which is attached to the connector 151 of the motherboard 150, is separated simultaneously with the pivoting the pivot member 132, and thus the main body 100 is separated from the guide bracket 120.

The user inserts his/her finger into the half-spherical pivot auxiliary recess 137, which is spaced a certain interval apart from the resilient push piece 133 and is formed on the top surface of the pivot member 132, and then pulls the pivot member 132 so that the ejector 130 is easily pivoted.

As seen from the foregoing, the circuit board attaching and detaching apparatus has an advantage in that it does not require much force, because the guide bracket to which the circuit board fixed to is attached and detached to and from the main body by pivoting of the ejector in a one-touch fashion.

Furthermore, the apparatus has another advantage in that no separate tool for releasing screws as in the prior art is needed because the circuit board is attached and detached to and from the main body by pivoting of the ejector in a one-touch fashion.

In addition, the apparatus has yet another advantage in that protruding screws as in the prior art are eliminated, because the ejector is provided on the lower portion of the guide bracket and is inserted and extracted into and from the main body as the guide bracket is attached and detached, so that it is possible to improve appearance.

Although an embodiment of the present invention has been described for illustrative purposes, it is apparent to those skilled in the art that various modifications, additions and substitutions are possible, without departing from the scope and spirit of the invention as recited in the accompanying claims.

What is claimed is:

1. An apparatus for attaching and detaching a circuit board comprising:
   a main body open at a front thereof and including a plurality of racks arranged in an interior portion thereof;
   a motherboard arranged at an inner rear portion of the main body;
   a connector arranged on the motherboard for transmitting electronic signals and electrical power to the circuit board;

a guide bracket mounted on the circuit board to guide the circuit board into one of the plurality of racks, and including a plurality of sockets arranged on a front thereof; and an ejector rotatably mounted on the guide bracket, the ejector holding the guide bracket by pushing the main body upon the circuit board being attached to the connector, and the ejector detaching the circuit board from the connector by pulling the guide bracket as the ejector rotates, wherein the ejector comprises: a pivot member rotatably mounted on the guide bracket, the pivot member pulling the guide bracket as the pivot member rotates; and a resilient push piece cantilevered on the pivot member, the resilient push piece pushing the main body upon the circuit board being attached to the connector, and the resilient push piece releasing the pivot member from the main body upon the resilient push piece being pulled.

2. The apparatus as set forth in claim 1, wherein the guide bracket is attached to and detached from the main body in a horizontal direction.

3. The apparatus as set forth in claim 1, wherein:

each of the plurality of racks includes a support to guide and support insertion of the guide bracket on both sides thereof; and the pivot member includes a guide groove inserted into the side of the support and supporting the pivoting of the pivot member as a point of force application wherein the pivot member pulls the guide bracket to detach the circuit board from the connector.

4. The apparatus as set forth in claim 1, wherein:

the pivot member further includes a first guide member protruding from the pivot member and inserted into a first guide hole arranged on a bottom surface of the guide bracket to guide the pivoting of the pivot member.

5. The apparatus as set forth in claim 1, wherein:

the main body further includes a hooked recess; and the resilient push piece further includes a hooking nose protruding from an outer side thereof and inserted into the hooked recess as the pivot member rotates for engaging the pivot member to the main body.

6. The apparatus as set forth in claim 1, wherein:

the resilient push piece further includes a second guide member protruding from an upper outer side thereof; and the main body further includes a second guide hole along which the second guide member slides as the pivot member rotates to guide the pivoting of the pivot member.

7. The apparatus as set forth in claim 1, wherein the pivot member further includes a pivot auxiliary recess spaced a certain interval apart from the resilient push piece on a top surface thereof to facilitate a user pulling the pivot member.

8. The apparatus as set forth in claim 1, wherein the resilient push piece further includes a knurl on an outer side thereof.

* * * * *